(12) United States Patent
Dunn et al.

(10) Patent No.: US 9,655,289 B2
(45) Date of Patent: May 16, 2017

(54) HYBRID REAR COVER AND MOUNTING BRACKET FOR ELECTRONIC DISPLAY

(71) Applicant: Manufacturing Resources International, Inc., Alpharetta, GA (US)

(72) Inventors: William Dunn, Alpharetta, GA (US); Marcos Diaz, Alpharetta, GA (US); Kyle Azevedo, Alpharetta, GA (US)

(73) Assignee: MANUFACTURING RESOURCES INTERNATIONAL, INC., Alpharetta, GA (US)

( * ) Notice: Subject to any disclaimer, the term of this patent is extended or adjusted under 35 U.S.C. 154(b) by 85 days.

(21) Appl. No.: 14/645,076

(22) Filed: Mar. 11, 2015

(65) Prior Publication Data

US 2015/0264826 A1    Sep. 17, 2015

Related U.S. Application Data

(60) Provisional application No. 61/951,344, filed on Mar. 11, 2014.

(51) Int. Cl.
*H05K 7/20* (2006.01)
*G02F 1/1333* (2006.01)
*H04N 5/64* (2006.01)
*G02F 1/1335* (2006.01)

(52) U.S. Cl.
CPC ... *H05K 7/20972* (2013.01); *G02F 1/133308* (2013.01); *H04N 5/64* (2013.01); *G02F 1/133603* (2013.01); *G02F 2001/133314* (2013.01); *G02F 2001/133628* (2013.01); *Y10T 29/49826* (2015.01)

(58) Field of Classification Search
CPC ............. H05K 7/20972; H05K 5/0204; H05K 7/20145; H05K 7/2039; H05K 5/0017; G02F 1/133308; G02F 1/133603; G02F 2001/133628; G02F 2001/133314; G02F 1/1333; H04N 5/64
USPC ........................... 361/694–696, 681, 679.21
See application file for complete search history.

(56) References Cited

U.S. PATENT DOCUMENTS

| 5,748,269 | A | | 5/1998 | Harris | |
|---|---|---|---|---|---|
| 6,104,451 | A | * | 8/2000 | Matsuoka | G02F 1/133308 349/58 |
| 7,667,964 | B2 | * | 2/2010 | Kang | G02F 1/133308 313/582 |
| 8,320,119 | B2 | * | 11/2012 | Isoshima | H05K 7/20972 165/104.34 |

(Continued)

*Primary Examiner* — Adam B Dravininkas
(74) *Attorney, Agent, or Firm* — Standley Law Group LLP

(57) ABSTRACT

A system and method for mounting an electronic display is disclosed herein. A rear cover mounting bracket may contain a rear plate and a sidewall which surrounds a perimeter of the plate. A plurality of mounting holes may be placed within the plate to allow fastening the rear plate to a vertical surface. An electronic display assembly module may contain a thermal plate where the attachment of the rear cover mounting bracket to the module creates a plenum which can house one or more electronic components. In a preferred embodiment, the rear plate contains a pair of hooks and the module contains a pair of corresponding cylinders which can be engaged with the hooks so that the module can hang from the hooks.

23 Claims, 6 Drawing Sheets

(56) References Cited

U.S. PATENT DOCUMENTS

| | | | | |
|---|---|---|---|---|
| 8,418,387 | B2* | 4/2013 | Swatt | G09F 7/18 |
| | | | | 361/679.21 |
| 9,317,060 | B2* | 4/2016 | Dunn | G06F 1/1601 |
| 2003/0039094 | A1* | 2/2003 | Sarkinen | H05K 5/0017 |
| | | | | 361/679.27 |
| 2009/0016004 | A1* | 1/2009 | McCoy | G06F 1/1632 |
| | | | | 361/679.21 |
| 2009/0086430 | A1* | 4/2009 | Kang | G02F 1/133385 |
| | | | | 361/695 |
| 2010/0220249 | A1* | 9/2010 | Nakamichi | H05K 5/02 |
| | | | | 348/836 |
| 2011/0116000 | A1* | 5/2011 | Dunn | G02F 1/133382 |
| | | | | 349/58 |
| 2011/0116231 | A1* | 5/2011 | Dunn | H04N 5/64 |
| | | | | 361/695 |
| 2011/0122162 | A1* | 5/2011 | Sato | G02F 1/133385 |
| | | | | 345/690 |
| 2011/0134356 | A1* | 6/2011 | Swatt | G09F 7/18 |
| | | | | 349/58 |
| 2013/0270975 | A1 | 10/2013 | Dunn | |
| 2013/0294039 | A1* | 11/2013 | Chao | H05K 5/0204 |
| | | | | 361/752 |
| 2013/0329363 | A1* | 12/2013 | Dunn | G06F 1/1601 |
| | | | | 361/694 |

\* cited by examiner

HYBRID REAR COVER AND MOUNTING BRACKET FOR ELECTRONIC DISPLAY

CROSS-REFERENCE TO RELATED APPLICATIONS

This application claims priority to U.S. Application No. 61/951,344 filed on Mar. 11, 2014 and is herein incorporated by reference in its entirety.

TECHNICAL FIELD

Embodiments generally relate to systems and methods for installing and cooling electronic displays.

BACKGROUND OF THE ART

Electronic displays are sometimes used in outdoor environments or other areas where the surrounding temperatures may be high or there may be other sources of heat such as solar loading causing the temperatures within the display to rise. However, some portions of the display can be difficult to cool as simply ingesting ambient air into some portions of the display can introduce dust and contaminates into sensitive portions of the display, which can lead to premature failures. Further, it is now desirable to provide an improved system for installing large electronic displays in public areas.

SUMMARY OF THE EXEMPLARY EMBODIMENTS

A system and method for mounting an electronic display is disclosed herein. A rear cover mounting bracket may contain a rear plate and a sidewall which surrounds a perimeter of the plate. A plurality of mounting holes may be placed within the plate to allow fastening the rear plate to a vertical surface. An electronic display assembly module may contain a thermal plate where the attachment of the rear cover mounting bracket to the module creates a plenum which can house one or more electronic components. In a preferred embodiment, the rear plate contains a pair of hooks and the module contains a pair of corresponding cylinders which can be engaged with the hooks so that the module can hang from the hooks.

The foregoing and other features and advantages of the present invention will be apparent from the following more detailed description of the particular embodiments, as illustrated in the accompanying drawings.

BRIEF DESCRIPTION OF THE DRAWINGS

A better understanding of an exemplary embodiment will be obtained from a reading of the following detailed description and the accompanying drawings wherein identical reference characters refer to identical parts and in which.

DETAILED DESCRIPTION

Figure 1:
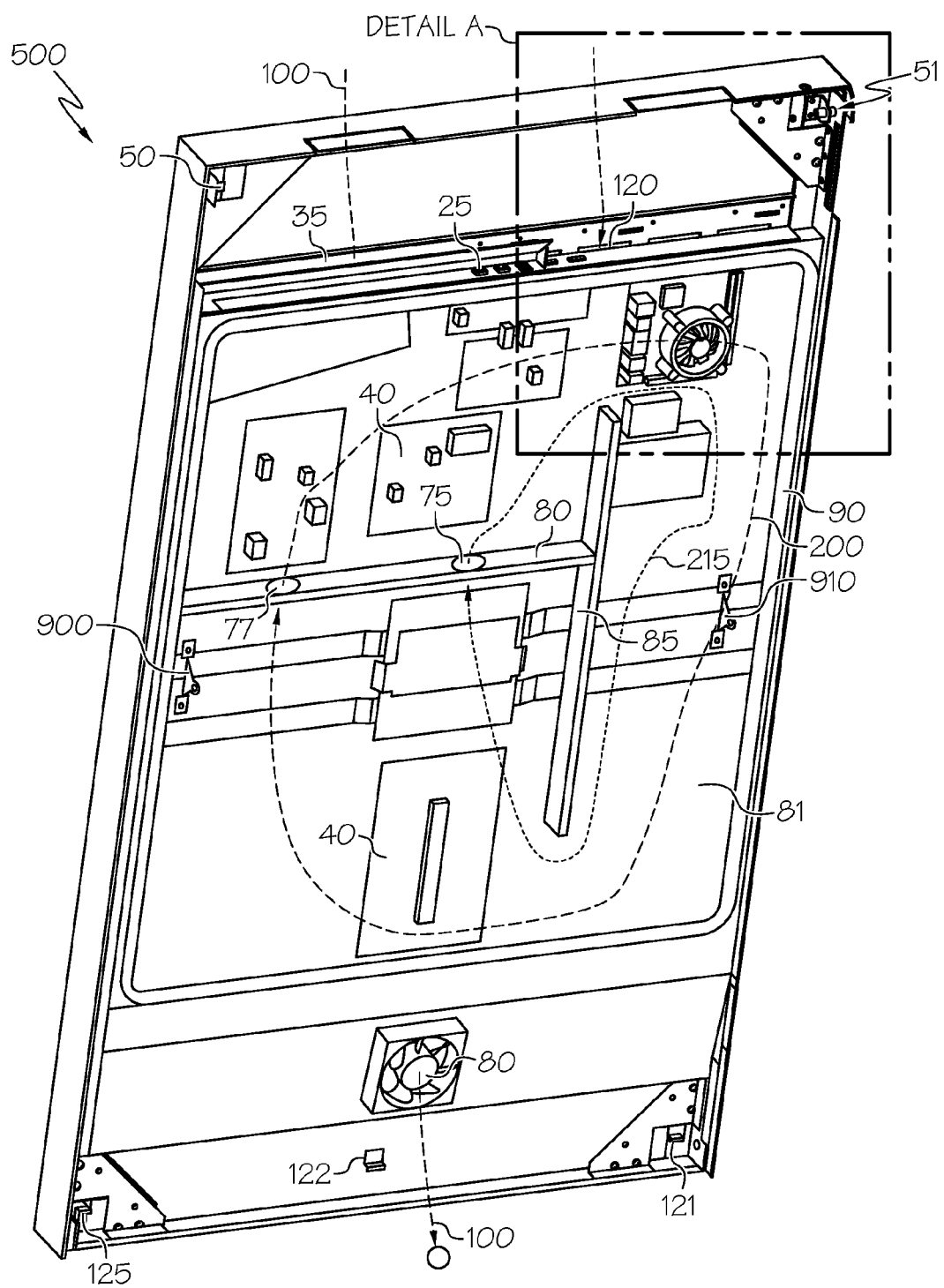
FIG. 1 is a rear perspective view of an exemplary electronic display assembly module showing Detail A.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a rear perspective view of an exemplary electronic display assembly module 500 showing Detail A. A thermal mounting sheet 81 is placed behind the electronic display and contains a plurality of electrical assemblies 40 which may include but are not limited to: power supplies, video players, hard drives, microprocessors, printed circuit boards, and input/output electronics. A narrow channel 120 is preferably defined by the space between the thermal sheet 81 and the rear surface of the electronic display. External air 100 may be forced through the channel 120 by fan 80, which can then extract heat from both the rear surface of the electronic display as well as the thermal mounting sheet 81.

A gasket 90 is preferably attached to the thermal mounting sheet 81 and surrounds a portion of the perimeter of the thermal mounting sheet 81. When combined with the hybrid rear cover mounting bracket 550, the gasket 90 and sheet 81 define a gaseously-sealed plenum 91 which may contain the electrical assemblies 40. One or more fans 75/77 may cause the air within the plenum 91 to circulate around. Preferably, a pair of dividing walls 80/85 are used to define a loop around the plenum 91 which passes through only one of the dividing walls (here 80). In an exemplary embodiment, dividing wall 80 is perpendicular to dividing wall 85. Even more preferably, dividing wall 80 is arranged horizontally and contains the fan(s) while dividing wall 85 is connected to the end of dividing wall 80 but is arranged vertically and does not contain a fan. For exemplary airflow, it has been discovered that placing the first fan 75 near the center of the display assembly and the second fan 77 near the perimeter of the display assembly, causes a pair of circulating gas loops 215 and 200 respectfully. Preferably, the plenum 91 is sealed so that external air cannot enter the plenum 91 (and preferably prevents air, or any other gaseous matter with or without particulate, from exiting the plenum 91).

A plurality of input/output electrical connections 25 are preferably placed at the top of the module 500 and underneath a water guard 35. Also, a pair of mounting pins 50 and 51 are arranged at the top of the module 500. A trio of latches 121, 122, 125 are preferably arranged at the bottom of the module 500, although embodiments can be practiced within one or two latches only. Also shown in this figure are the attachment brackets 900 and 910 for gas springs 250 or other supporting resistive elements.

Figure 2:
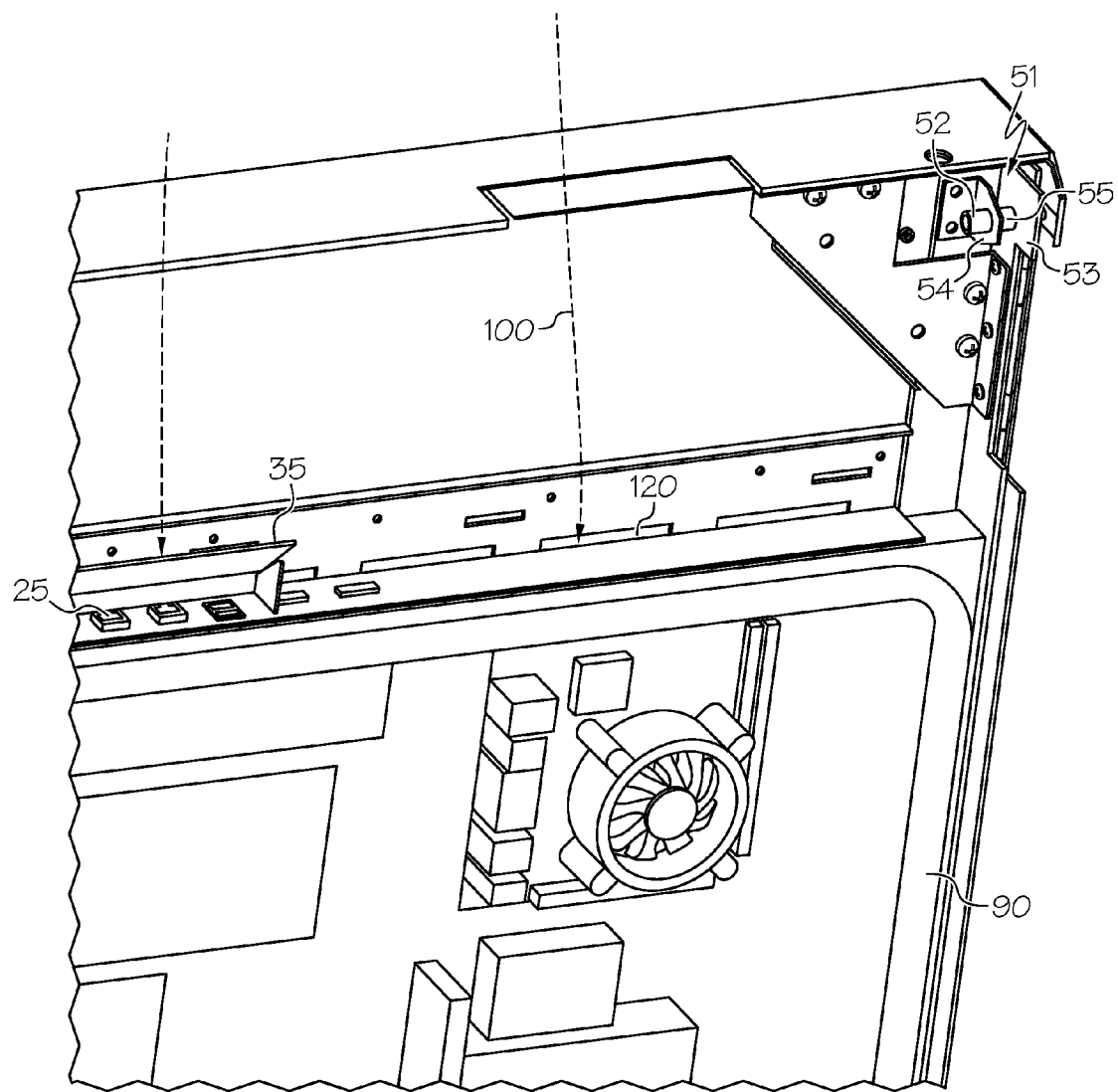
FIG. 2 is a detailed rear perspective view of Detail A shown in FIG. 1.

FIG. 2 is a detailed rear perspective view of Detail A shown in FIG. 1. Here, the details of the mounting pin (or rod or cylinder) 51 may be observed. In this embodiment, this can be described as a cylinder which travels horizontally and may be divided by two locating walls 53 (closest to the perimeter of the module 500) and 54 (closest to the center of the module 500). The cylinder can then be identified by the mounting portion 55 (located between walls 53/54) and the interior portion 52 (starting at the wall 54 and travelling towards the center of the module 500). The mounting pins can be solid or hollow and are preferably cylindrical.

Figure 3:
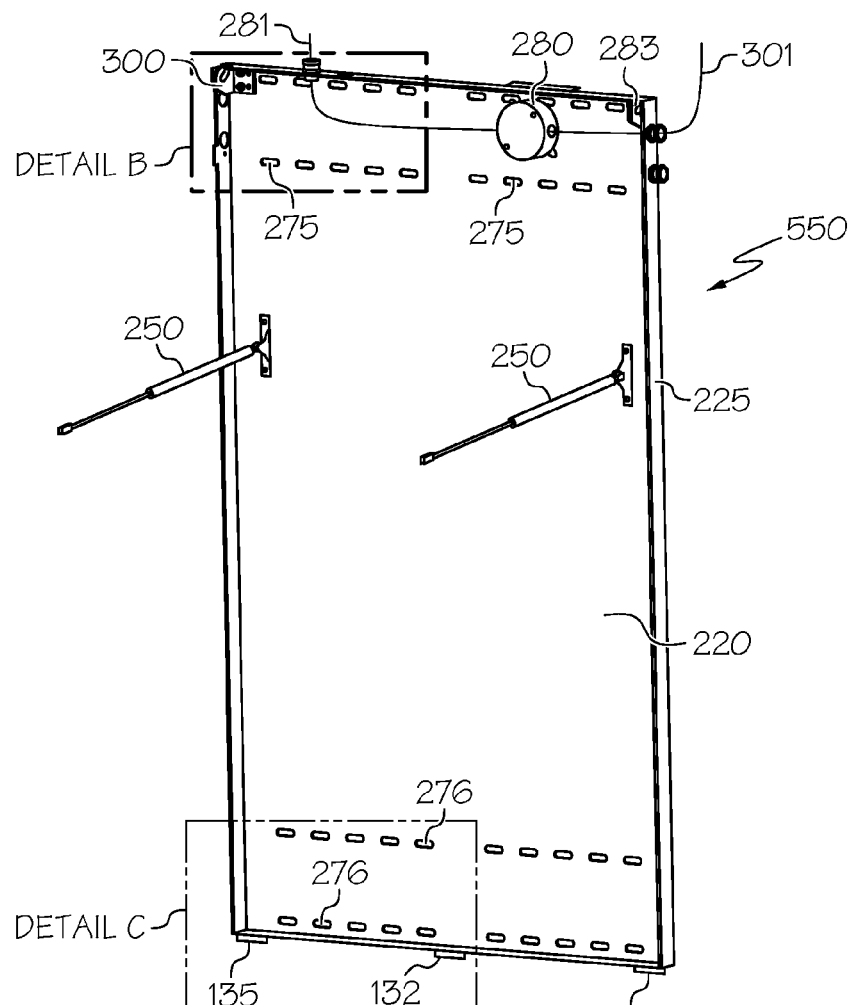
FIG. 3 is a front perspective view of an exemplary hybrid rear cover and mounting bracket, once fastened to a vertical surface and connected to service wiring.

FIG. 3 is a front perspective view of an exemplary hybrid rear cover and mounting bracket 550 (herein cover/bracket 550), once fastened to a vertical surface and connected to service wiring 281. The cover/bracket 500 preferably contains a substantially flat rear plate 220 with a sidewall 225 which surrounds the plate 220. A plurality of mounting holes 275 are preferably placed near the top of the cover/bracket 500 while another plurality of mounting holes 276 are placed near the bottom of the cover/bracket 500. In this way, the cover/bracket 500 can easily be mounted on a vertical surface where the service wiring 281 can be routed through the sidewall 225 and into a junction box 280 by a designated electrician. A second service line 283 may also exit the junction box 280 and could run to a second display module, allowing several cover/brackets to be installed and wired together in a daisy chain fashion. Generally, this electrical work requires permits, licenses, and/or approval by an electrical inspector. With this exemplary embodiment, this work can be completed and approved before the electronic display modules 500 are even shipped to the location.

A pair of gas springs 250 or other resistive device may be attached to the rear plate 220 and correspond with the attachment plates 900/910 on the electronic display module 500. A trio of latches 130, 132, and 135 may be placed at the bottom of the cover/bracket 550 and correspond to the latches 121, 122, and 125 on the module 500 respectively. Of course, as noted above, only a single latch or a pair of latches may be used in some embodiments. A pair of mounting hooks 300 and 301 are preferably placed at the top of the cover/bracket 550 and correspond to the mounting pins 50 and 51 respectively. Preferably, the hook 300 would wrap around a portion of the circumference of the mounting portions 55, where the hook 300 is stabilized laterally between the walls 54 and 53.

Figure 4:
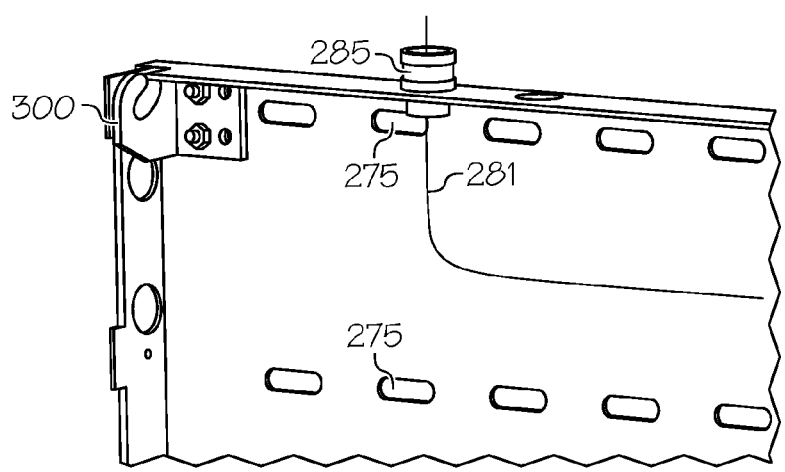
FIG. 4 is a detailed front perspective view of Detail B shown in FIG. 3.

FIG. 4 is a detailed front perspective view of Detail B shown in FIG. 3. A fitting 285 may permit conduit (not shown) to seal with the sidewall 225 and allow the service wire 281 to pass through the sidewall 225 to meet the junction box 280.

Figure 5:
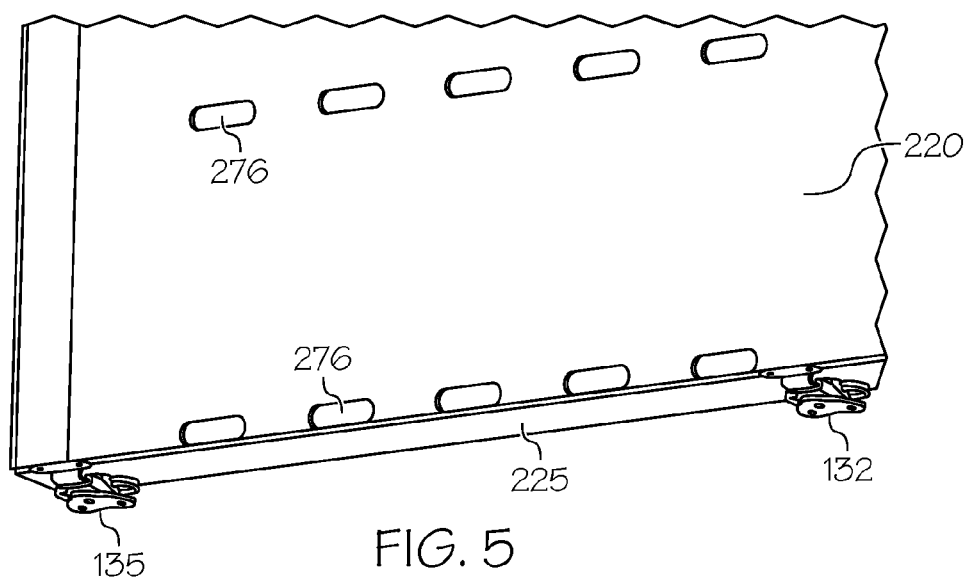
FIG. 5 is a detailed front perspective view of Detail C shown in FIG. 3.

FIG. 5 is a detailed front perspective view of Detail C shown in FIG. 3.

Figure 6:
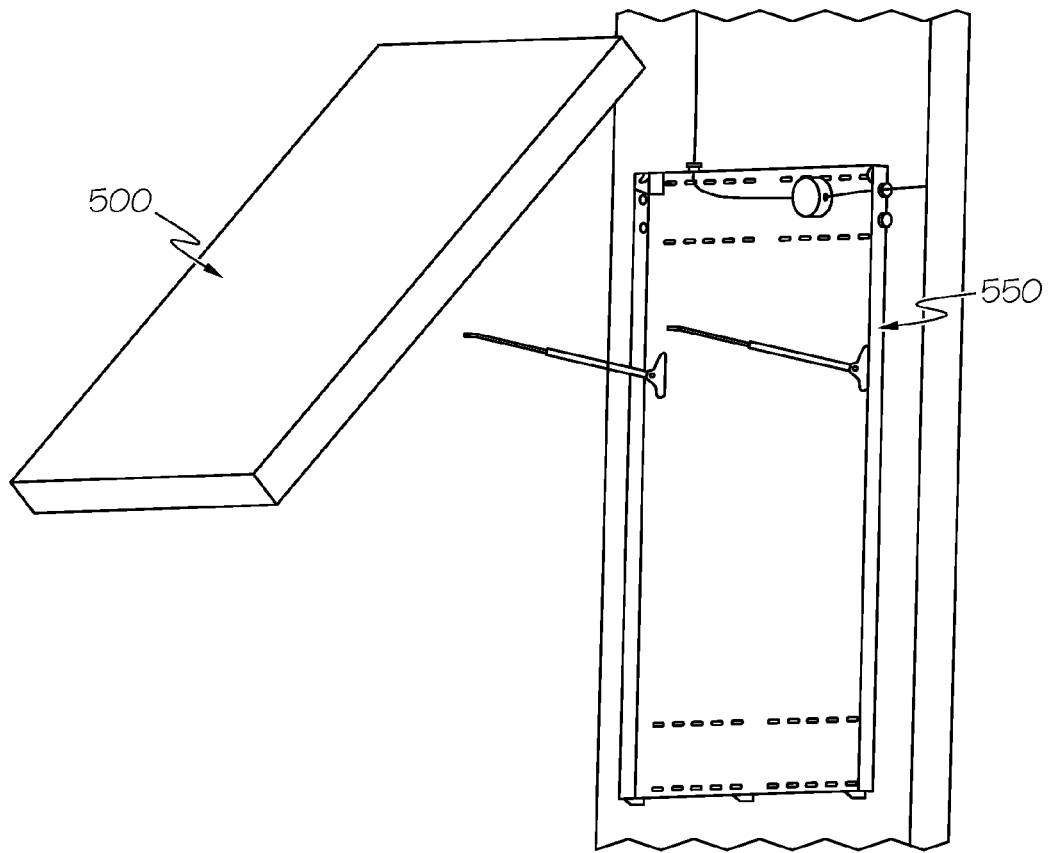
FIG. 6 is a front perspective view of the exemplary method for attaching the electronic display assembly module to the hybrid rear cover and mounting bracket.

FIG. 6 is a front perspective view of the exemplary method for attaching the electronic display assembly module 500 to the hybrid rear cover and mounting bracket 550. Once the cover/bracket 550 has been mounted to a vertical surface (and preferably after the service wiring has been ran to the junction box), the module 500 may hang from the interaction of the hooks 300/301 with the pins 51/50. At this point, the bottom of the module 500 can be rotated outwardly so that the gas springs 250 can be attached to the module 500. Once these are attached, the hooks 300/301 remain within the pins 51/50 but the bottom of the module 500 is held away from the cover/bracket 550 so that the module 500 can be electrically connected with the junction box 280. Once the module 500 is electrically connected, the bottom of the module 500 is rotated towards the cover/bracket 550 until the latches at the bottom of the two assemblies can be engaged.

Figure 7:
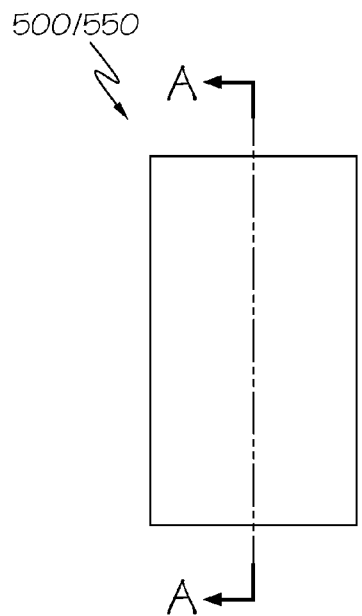
FIG. 7 is a front elevation view of the hybrid rear cover and mounting bracket once assembled with the electronic display assembly module and indicating the section line A-A.

FIG. 7 is a front elevation view of the hybrid rear cover and mounting bracket 550 once assembled with the electronic display assembly module 500 and indicating the section line A-A.

Figure 8:
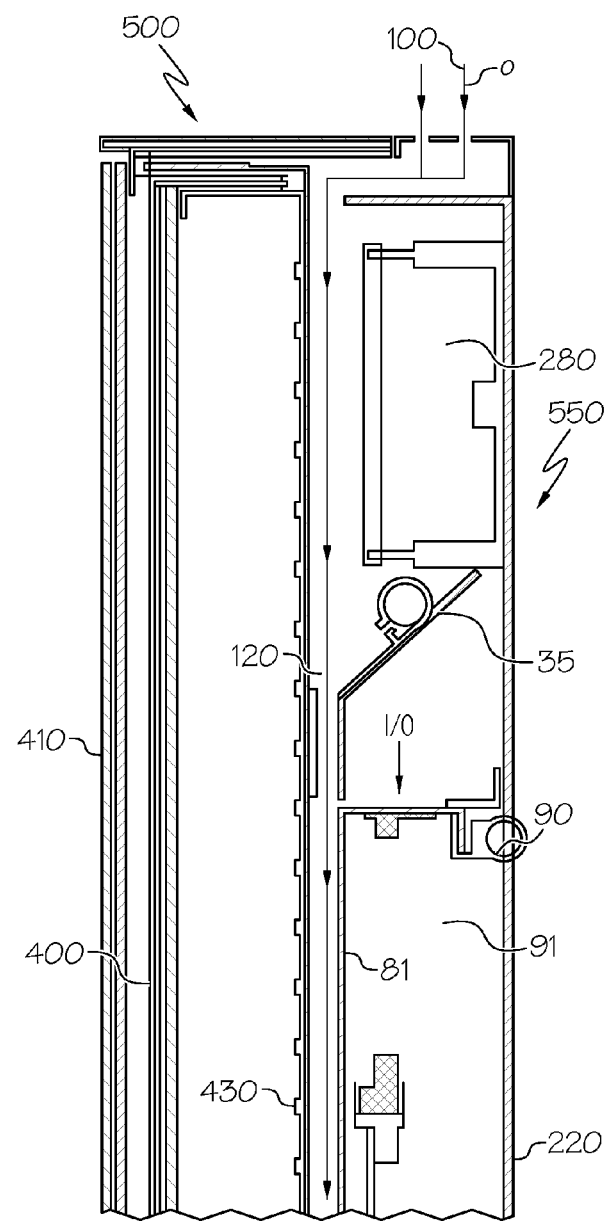
FIG. 8 is a partial section view taken along the section line A-A and showing the top portion of the assembly.

FIG. 8 is a partial section view taken along the section line A-A and showing the top portion of the assembly. When the latches at the bottom of the two assemblies engage, the gasket 90 is preferably compressed against the rear plate 220 to define the plenum 91. A front cover transparent plate 410 is preferably placed in front of the electronic display and a flow of external air 100 is shown travelling behind the electronic display and through the channel 120. Although any type of flat panel electronic display could be used, this particular embodiment uses an LCD display 400 with a direct LED backlight 430. Thus, in this embodiment, the channel 120 is defined between the rear surface of the LED backlight 430 and the thermal mounting plate 81. However, alternative embodiments may utilize any type of flat panel electronic display, including but not limited to plasma, OLED, electroluminescent polymers, or similar where the channel 120 is defined between the rear surface of these displays and the thermal plate 81.

Figure 9:
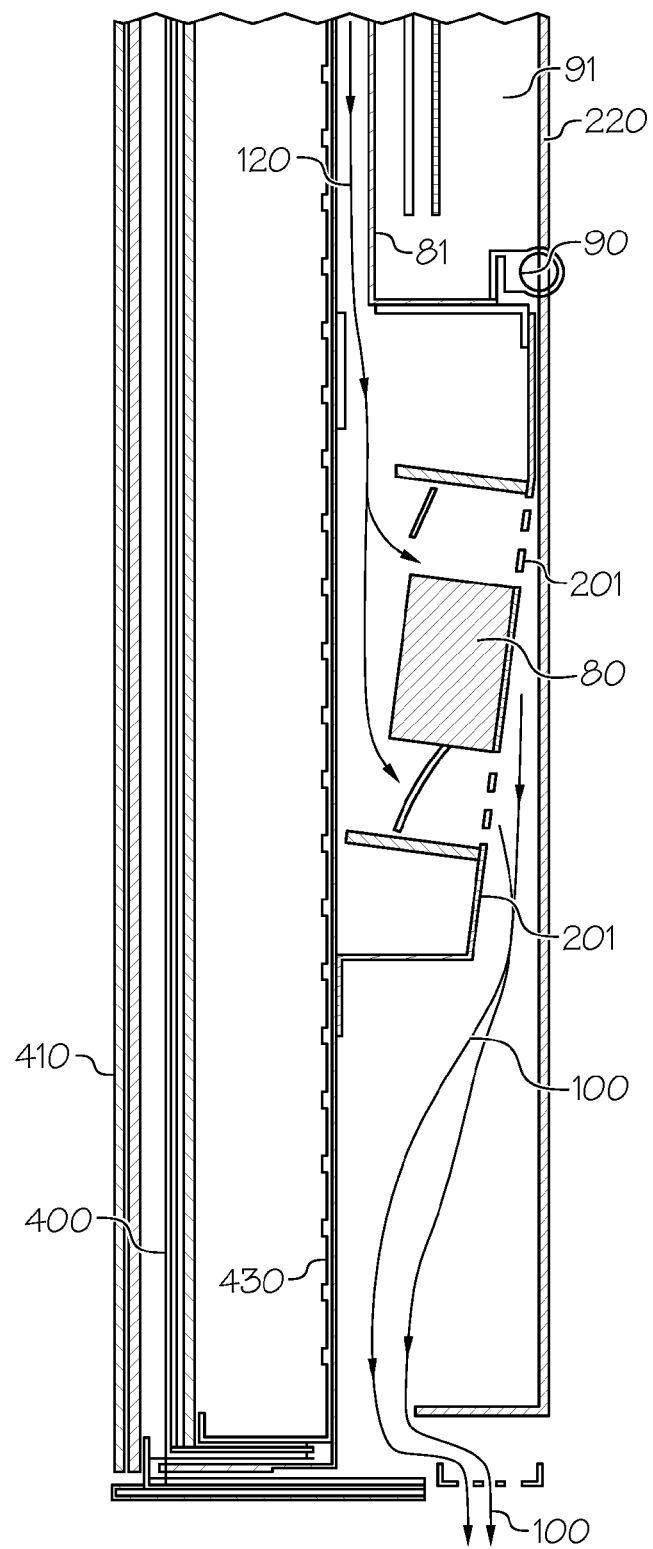
FIG. 9 is a partial section view taken along the section line A-A and showing the bottom portion of the assembly.

FIG. 9 is a partial section view taken along the section line A-A and showing the bottom portion of the assembly. The fan 80 is preferably positioned to draw the external air 100 through the channel 120, along the rear portion of the backlight 430 (or electronic display), and exhausted out of the bottom of the assembly. Of course, the external air 100 could also be ingested at the bottom and exhausted out of the top. The fan 80 is preferably placed within a cavity defined between the backlight 430 and the rear plate 220 and is preferably not immediately adjacent to the exhaust port on the housing, although this is not required. Generally speaking, a portion 201 of the housing may connect between the rear surface of the backlight 430 (or electronic display) and the rear plate 220, where the fan 80 is mounted on this portion 201 of the housing.

Having shown and described a preferred embodiment of the invention, those skilled in the art will realize that many variations and modifications may be made to affect the described invention and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

We claim:

1. A system for mounting an electronic display comprising:
   a rear cover mounting bracket having a rear plate and sidewall which surrounds a perimeter of the plate;
   a plurality of mounting holes placed within the rear plate;
   an electronic display assembly module having a thermal plate where the electronic display assembly module attaches to the rear cover mounting bracket to define a plenum between the thermal plate and the rear plate, the electronic display assembly module having four sides including a bottom and top side;
   a power module placed within the plenum;
   wherein the electronic display assembly module is adapted to allow one side of the electronic display assembly module to be rotated outwardly away from the rear cover mounting bracket when the electronic display assembly module is attached to the rear cover mounting bracket;
   a first partition within the plenum; and
   a circulating fan positioned within the plenum for circulating gas around the plenum.

2. The system of claim 1 wherein:
   the mounting holes are placed outside of the plenum.

3. The system of claim 1 wherein:
   the sidewall is substantially perpendicular to the rear plate.

4. The system of claim 1 wherein:
   the rear plate is adapted to fit against a vertical surface.

5. The system of claim 1 further comprising:
   a channel defined by the space between an electronic display and the thermal plate; and
   a fan positioned to draw external air through the channel but not through the plenum.

6. The system of claim 1 further comprising:
   a pair of hooks positioned near a top of the rear cover mounting bracket; and
   a pair of horizontal pins placed near a top of the electronic display assembly module where the pins are sized to fit within the hooks.

7. The system of claim 1 further comprising:
   a pair of hooks attached to the rear plate; and
   a pair of round posts attached to the electronic display assembly module which fit within the hooks and allow the electronic display assembly module to hang from the hooks.

8. The system of claim 1, further comprising:
   a second partition within the plenum that is oriented substantially perpendicular to the first partition; and
   wherein the circulating fan is positioned on either the first or the second partition for circulating gas around the plenum.

9. The system of claim 8, wherein the first and second partitions form a "T" shape.

10. The system of claim 8, wherein the gas within the plenum circulates in a loop pattern when the plenum is sealed.

11. The system of claim 8, wherein the first partition is a dividing wall arranged horizontally in the plenum and wherein the second partition is a dividing wall arranged vertically in the plenum.

12. The system of claim 1, wherein the gas is air.

13. A system for mounting an electronic display comprising:
   a rear cover mounting bracket having a rear plate;
   a pair of hooks attached to the rear plate;
   an electronic display assembly module containing an electronic display and having a pair of horizontal posts, each post being sized to fit within a hook so that the electronic display assembly module can hang from the hooks, the electronic display assembly module having a thermal plate wherein the electronic display assembly module attaches to the rear cover mounting bracket to define a plenum between the thermal plate and the rear plate;
   a power module placed within the plenum;
   a latch positioned near the bottom of the electronic display assembly module;
   wherein the electronic display assembly module is adapted to allow the bottom of the electronic display assembly module to rotate outwardly away from the rear cover mounting bracket when the electronic display assembly module is attached to the rear cover mounting bracket;
   a first partition within the plenum;
   a second partition within the plenum that is oriented substantially perpendicular to the first partition;
   a circulating fan positioned on either the first or the second partition for circulating gas around the plenum; and
   wherein the gas within the plenum circulates in a loop pattern when the plenum is sealed.

14. The system of claim 13 further comprising:
   a plurality of holes in the rear plate for attaching the rear plate to a wall.

15. The system of claim 13 further comprising:
   a pair of locating walls positioned on each post where the space between the locating walls defines an area of each post that is accepted by the hook.

16. The system of claim 13 further comprising:
   a pair of locating walls placed on each post which define an area of the post which is between the walls for accepting the hook.

17. The system of claim 13 further comprising:
   a channel within the electronic display assembly module that is defined by the space between the electronic display and a thermal plate;
   a fan positioned to force external air through the channel.

18. The system of claim 13, wherein the first partition is a dividing wall arranged horizontally in the plenum and wherein the second partition is a dividing wall arranged vertically in the plenum.

19. A method for mounting an electronic display comprising the steps of:
   attaching a rear cover mounting bracket to a vertical surface, said rear cover mounting bracket having a pair of hooks positioned near a top of the rear cover mounting bracket;

presenting an electronic display assembly module having a thermal plate and a pair of horizontal rods near a top of the electronic display assembly module;
engaging the horizontal rods with the hooks so that the electronic display assembly module can hang from the hooks;
rotating a bottom portion of the electronic display assembly module outwardly away from the rear cover mounting bracket when the electronic display assembly module is attached to the rear cover mounting bracket;
attaching a bottom portion of the rear cover mounting bracket to the bottom portion of the electronic display assembly module;
creating a plenum between the rear cover mounting bracket and the thermal plate;
placing a power module within the plenum;
placing a first partition within the plenum;
positioning a circulating fan on the first partition for circulating gas around the plenum; and
circulating the gas in a loop pattern when the plenum is sealed.

20. The method of claim 19 wherein:
the entire weight of the electronic display assembly module is permitted to hang from the hooks once engaged with the horizontal rods.

21. The method of claim 19 wherein:
the step of engaging the horizontal rods with the hooks comprises placing the hook on a portion of the rod which is defined by the space between a pair of locating walls.

22. The method of claim 19 wherein:
the step of attaching the rear cover mounting bracket to the electronic display assembly module comprises engaging a first portion of a latch which is attached to the rear cover mounting bracket with a second portion of a latch which is attached to the electronic display assembly module.

23. The method of claim 19 wherein:
the step of attaching the rear cover mounting bracket to the electronic display assembly creates the plenum which is sealed from the exterior air.

* * * * *

UNITED STATES PATENT AND TRADEMARK OFFICE
CERTIFICATE OF CORRECTION

| | | |
|---|---|---|
| PATENT NO. | : 9,655,289 B2 | |
| APPLICATION NO. | : 14/645076 | |
| DATED | : May 16, 2017 | |
| INVENTOR(S) | : William Dunn, Marcos Diaz and Kyle Azevedo | |

It is certified that error appears in the above-identified patent and that said Letters Patent is hereby corrected as shown below:

In the Drawings

Sheet 1, Fig. 1, the reference numeral 80 located approximately halfway down and associated with a horizontal dividing wall attached to a vertical dividing wall 85 and having a first fan 75 and a second fan 77 located thereon, should be renumbered to reference numeral 83 consistent with the revised specification provided below.

In the Specification

Column 3, Lines 1-22, please delete "a gasket 90 is preferably attached to the thermal mounting sheet 81 and surrounds a portion of the perimeter of the thermal mounting sheet 81. When combined with the hybrid rear cover mounting bracket 550, the gasket 90 and sheet 81 define a gaseously-sealed plenum 91 which may contain the electrical assemblies 40. One or more fans 75/77 may cause the air within the plenum 91 to circulate around. Preferably, a pair of dividing walls 80/85 are used to define a loop around the plenum 91 which passes through only one of the dividing walls (here 80). In an exemplary embodiment, dividing wall 80 is perpendicular to dividing wall 85. Even more preferably, dividing wall 80 is arranged horizontally and contains the fan(s) while dividing wall 85 is connected to the end of dividing wall 80 but is arranged vertically and does not contain a fan. For exemplary airflow, it has been discovered that placing the first fan 75 near the center of the display assembly and the second fan 77 near the perimeter of the display assembly, causes a pair of circulating gas loops 215 and 200 respectfully. Preferably, the plenum 91 is sealed so that external air cannot enter the plenum 91 (and preferably prevents air, or any other gaseous matter with or without particulate, from exiting the plenum 91)." and insert --A gasket 90 is preferably attached to the thermal mounting sheet 81 and surrounds a portion of the perimeter of the thermal mounting sheet 81. When combined with the hybrid rear cover mounting bracket 550, the gasket 90 and sheet 81 define a gaseously-sealed plenum 91 which may contain the electrical assemblies 40. One or more fans 75/77 may cause the air within the plenum 91 to circulate around. Preferably, a pair of dividing walls 83/85 are used to define a loop around the plenum 91 which passes through only one of the dividing walls (here 83). In an exemplary embodiment, dividing wall 83 is perpendicular to dividing wall 85. Even more preferably, dividing wall 83 is arranged horizontally and contains the fan(s) while dividing wall 85 is connected to the end Signed and Sealed this
Eleventh Day of December, 2018

Andrei Iancu
*Director of the United States Patent and Trademark Office* of dividing wall 83 but is arranged vertically and does not contain a fan. For exemplary airflow, it has been discovered that placing the first fan 75 near the center of the display assembly and the second fan 77 near the perimeter of the display assembly, causes a pair of circulating gas loops 215 and 200 respectfully. Preferably, the plenum 91 is sealed so that external air cannot enter the plenum 91 (and preferably prevents air, or any other gaseous matter with or without particulate, from exiting the plenum 91).--.